(12) United States Patent
Hiller et al.

(10) Patent No.: US 10,094,892 B2
(45) Date of Patent: *Oct. 9, 2018

(54) METHODS AND APPARATUS FOR SAMPLE TEMPERATURE CONTROL IN NMR SPECTROMETERS

(71) Applicant: President and Fellows of Harvard College, Cambridge, MA (US)

(72) Inventors: Sebastian Hiller, Zurich (CH); Gerhard Wagner, Brookline, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 973 days.

This patent is subject to a terminal disclaimer.

(21) Appl. No.: 14/562,028

(22) Filed: Dec. 5, 2014

(65) Prior Publication Data

US 2015/0212169 A1     Jul. 30, 2015

Related U.S. Application Data

(63) Continuation of application No. 13/201,056, filed as application No. PCT/US2010/000417 on Feb. 12, 2010, now Pat. No. 8,941,382.

(Continued)

(51) Int. Cl.
| | | |
|---|---|---|
| *G01R 33/31* | (2006.01) | |
| *G01R 33/34* | (2006.01) | |
| *G01R 33/46* | (2006.01) | |

(52) U.S. Cl.
CPC ....... *G01R 33/31* (2013.01); *G01R 33/34092* (2013.01); *G01R 33/4608* (2013.01); *G01R 33/4616* (2013.01); *G01R 33/4625* (2013.01)

(58) Field of Classification Search
CPC .............. G01R 33/31; G01R 33/34092; G01R 33/4608; G01R 33/4616; G01R 33/4625
See application file for complete search history.

(56) References Cited

U.S. PATENT DOCUMENTS

| | | |
|---|---|---|
| 6,218,835 B1 | 4/2001 | Smallcombe |
| 6,768,305 B1 | 7/2004 | Keifer |

(Continued)

FOREIGN PATENT DOCUMENTS

JP     3-156394     7/1991

OTHER PUBLICATIONS

International Search Report dated Oct. 11, 2010 for Application No. PCT/US2010/000417.

(Continued)

*Primary Examiner* — Dixomara Vargas
(74) *Attorney, Agent, or Firm* — Wolf, Greenfield & Sacks, P.C.

(57) ABSTRACT

Described are methods and apparatus, referred to as "temperature-lock," which can control and stabilize the sample temperature in an NMR spectrometer, in some instances with a precision and an accuracy of below about 0.1 K. In conventional setups, sample heating caused by experiments with high-power radio frequency pulses is not readily detected and is corrected by a cumbersome manual procedure. In contrast, the temperature-lock disclosed herein automatically maintains the sample at the same reference temperature over the course of different NMR experiments. The temperature-lock can work by continuous or non-continuous measurement of the resonance frequency of a suitable temperature-lock nucleus and simultaneous adaptation of a temperature control signal to stabilize the sample at a reference temperature value. Inter-scan periods with variable length can be used to maintain the sample at thermal equilibrium over the full length of an experiment.

29 Claims, 8 Drawing Sheets

Related U.S. Application Data

(60) Provisional application No. 61/152,619, filed on Feb. 13, 2009.

(56) References Cited

U.S. PATENT DOCUMENTS

| | | | | |
|---|---|---|---|---|
| 7,345,484 B2* | 3/2008 | Nakahara | ............... | G01R 33/31 324/318 |
| 8,941,382 B2* | 1/2015 | Hiller | .................... | G01R 33/31 324/309 |
| 2007/0096734 A1 | 5/2007 | Lukens et al. | | |
| 2007/0166730 A1 | 7/2007 | Suresh et al. | | |

OTHER PUBLICATIONS

Van Geet, A.L., "Calibration of methanol nuclear magnetic resonance thermometer at low temperature," *Anal. Chem.* 42, 679-680 (1970).

Hiller, S. et al., APSY-NMR with proteins: practical aspects and backbone assignment, *J. Biomol. NMR* 42, 179-195 (2008).

U.S. Appl. No. 13/201,056, filed Nov. 14, 2011, Hiller et al.

\* cited by examiner

METHODS AND APPARATUS FOR SAMPLE TEMPERATURE CONTROL IN NMR SPECTROMETERS

CROSS-REFERENCE TO RELATED U.S. APPLICATIONS

The present application is a continuation of U.S. patent application Ser. No. 13/201,056, filed on Nov. 14, 2011, titled "METHODS AND APPARATUS FOR SAMPLE TEMPERATURE CONTROL IN NMR SPECTROMETERS," which is a National Stage of PCTUS2010/000417, filed on Feb. 12, 2010, titled "METHODS AND APPARATUS FOR SAMPLE TEMPERATURE CONTROL IN NMR SPECTROMETERS," which claims a priority benefit to U.S. provisional patent application Ser. No. 61/152,619, filed on Feb. 13, 2009, titled " METHOD AND APPARATUS FOR ACCURATE AND PRECISE STABILIZATION OF THE SAMPLE TEMPERATURE IN NMR SPECTROMETERS WITH AUTOMATED COMPENSATION OF RADIO-FREQUENCY INDUCED HEATING," each of which is incorporated herein by reference.

FEDERALLY SPONSORED RESEARCH

This invention was made with government support under Grant No. GM 47467 awarded by the National Institute of Health. The government has certain rights in the invention.

FIELD OF THE DISCLOSURE

The technology described herein relates generally to control and stabilization of the temperature of samples inside nuclear magnetic resonance (NMR) spectrometers in an automated fashion with a high level of accuracy and precision. In certain embodiments, the temperature is automatically maintained during consecutive NMR experiments, in particular if their radio-frequency pulse schemes cause sample heating.

BACKGROUND

Control and stabilization of the sample temperature are important criteria for high-resolution NMR experiments, because the measured chemical shift is a physical property that can be sensitive to small temperature changes. NMR experiments employ radio frequency (RF)-pulses that induce sample heating due to dielectric absorption. Differential sample heating among a series of experiments causes difficulties for the analysis of the resulting spectra. For example, for protein structure determination, the side chain protons of proteins are often assigned using TOCSY-type experiments with many RF-pulses and strong sample heating. In contrast, NOESY experiments used to provide distance information feature only a few RF-pulses and cause thus little sample heating. The calculation of protein structures from these experiments depends on the correlation of the chemical shifts in both types of experiments and a high correspondence and control of the sample temperatures in these different experiments can be important in determining accurately protein structures.

Due to these reasons, it is important to control and stabilize the NMR sample temperature with accuracy and precision of the order of 0.1 K. The terms accuracy and precision are used here in their canonical definitions. The accuracy of temperature stabilization refers to the difference between a desired temperature and the actual average sample temperature. Temperature control and stabilization is accurate, if the apparatus creates and maintains the sample temperature at a value desired by the user. The precision of temperature stabilization refers to the standard deviation of the sample temperature. Temperature control and stabilization is precise, if the remaining temperature fluctuations are small, irrespective of whether the temperature is accurate.

In conventional NMR probes, the sample temperature control is achieved with a thermocouple located in the air stream that forms the temperature reservoir for the sample. A measurement of the air stream temperature with accuracy and precision of 0.1 K or below is typical in such conventional setups. However, these external measurements of the air stream do not detect the true sample temperature. RF-induced sample heating, often as large as five degrees K, is not detected and thus not corrected. Thus, despite a precision of 0.1 K, the accuracy of sample temperature stability is 5 K or larger in conventional systems.

An interactive method to correct differential RF-heating in a series of experiments is manual adjustment of the temperature control, by comparing one-dimensional (1D) traces of the spectrum of interest to a reference spectrum. Such a procedure is however error-prone, cumbersome and time-consuming and forbids itself for automated or high-throughput setups. Modern automated setups require that several different experiments on the same sample or the same experiment on different samples are consistently recorded and automatically analyzed. These demands cannot be fulfilled with an interactive method.

Highly accurate and precise measurements of the sample temperature can be achieved in a non-invasive way by using the temperature-dependence of the chemical shift of suitable nuclei as thermometers (e.g. van Geet, A. L., Calibration of methanol nuclear magnetic resonance thermometer at low temperature, *Anal. Chem.* 42, 679-680 (1970). This is being used in many practical NMR applications, in particular to calibrate the temperature unit of the NMR probe upon installation. However, only if these measurements are carried out in samples with an exactly defined composition, often containing the pure thermometer substance in bulk, the measured chemical shifts can be interpreted as temperatures. Such methods are thus not applicable on samples with a non-standard chemical composition.

A method for using direct NMR measurements to improve the temperature stabilization has been disclosed by H. Keiichiro, Japanese Patent 3-156394 (1991). The disclosed method uses a conventional field-frequency lock unit to extract a second frequency component besides the field-frequency lock signal, calculates the chemical shift difference of these two resonances, and compares the result with values from a reference table for the desired temperature. The outcome of this temperature measurement is then directly used to control the sample heater, either replacing the conventional thermocouple measurements or by adding the two values together. However, since chemical shifts are not only dependent on the temperature, but also on other sample parameters, like the pH value, the salt concentration, etc., the use of this method would require temperature reference tables for each of the infinite number of possible sample compositions. Since these tables are not available, the accuracy achieved by this method is as high as 10 K. Due to this drawback, the temperature controller as described in Japanese Patent 3-156394 is not practicable and has not become widely used.

SUMMARY

According to some aspects, a method is described that achieves accurate and precise stabilization of the NMR sample temperature by a combination of (i) repeatedly measuring the resonance frequency or chemical shift of a suitable inert thermometer substance, e.g., using either one-dimensional Fourier transform (1D FT) NMR combined with automated peak picking or frequency sweeping, (ii) using the measured data to generate dynamic temperature values for the control of the heater system, (iii) using a thermocouple measurement in the air stream to achieve precision, (iv) employing the automated procedure "MET" for a combined management of the experiments of interest and the generation of the temperature control signals. MET stands for "Management of Experiments and Temperature." By using inter-experimental periods of variable length, the steady state is established individually for each experiment in a series of experiments and the temperature can thus be kept at the same reference value for one or several different experiments in an automated fashion. The precision of the method disclosed here can be on the order of 0.1 K or less. The accuracy can be on the order of 0.1 K or less, which represents a 20-100 fold improvement over previous and conventional methods.

The systems and methods described herein may be referred to as "temperature-lock" in reference to the field-frequency lock that is commonly used to stabilize the static magnetic field of an NMR magnet against field drift or other disturbances, even though the technical details of the present technology differ from those of a field-frequency lock system.

Thus, it should be appreciated that according to some aspects, accurate and precise temperature control may be achieved by monitoring a sample temperature during the acquisition of NMR experiments. Such experiments may induce heating within a sample in some embodiments, and aspects of the technology described herein accurately and precisely compensate for such sample heating by monitoring changes in an NMR resonance frequency or chemical shift of a thermometer substance during experimentation, and adjusting an air temperature within the sample chamber during the experiments. According to some non-limiting embodiments, a trigger signal to start an NMR experiment is generated in response to comparing a monitored resonance frequency value or chemical shift value of a thermometer substance to a reference value. In certain embodiments, the reference value is previously acquired.

In some embodiments, the temperature-lock method is used in conjunction with a field-frequency lock. If a field-frequency lock is used, the resonance frequency of the field-frequency lock nucleus can serve as a reference value to define the chemical shift scale for all nuclei via indirect referencing. The nucleus for the field-frequency lock can differ from the nucleus used for the temperature-lock. In some embodiments, the nucleus used for the field-frequency lock is the same as the nucleus used for the temperature-lock. If the present invention is used without field-frequency lock, the chemical shift measurements of the temperature-lock substance can be referenced relative to an absolute standard. In such an embodiment, possible fluctuations or drifts of the static magnetic field can decrease the temperature lock precision.

According to one aspect, a nuclear magnetic resonance (NMR) system is provided. The NMR systems comprises a sample chamber, an adjustable heater to adjust an air temperature within the sample chamber, a thermocouple to provide a thermocouple signal representing the air temperature within the sample chamber, and a sensor to monitor a frequency response of a thermometer substance within a sample in the sample chamber and to provide a varying output signal indicative of the frequency response of the thermometer substance as a sample temperature of the thermometer substance varies. The NMR system further comprises a processor coupled to the sensor to receive the varying output signal of the sensor and to generate a compensation signal indicative of a target value of the air temperature. The NMR system further comprises a controller to compare the thermocouple signal and the compensation signal and to produce a feedback control signal, based on the comparison, for adjusting the adjustable heater.

According to another aspect, a method of operating a nuclear magnetic resonance (NMR) system is provided. The method comprises detecting an air temperature of a sample chamber of the NMR system, monitoring a frequency response of a thermometer substance in a sample within the sample chamber during an NMR experiment, and determining an experimental resonance frequency value from the frequency response. The method further comprises comparing the experimental resonance frequency value to a reference resonance frequency value, and, in response to comparing the experimental resonance frequency value to the reference resonance frequency value, iteratively generating a compensation signal indicative of a target value of the air temperature to make the experimental resonance frequency value approximately equal to the reference resonance frequency value. The method further comprises comparing the target value of the air temperature to the detected air temperature.

According to another aspect, at least one computer-readable storage medium is provided that is encoded with computer-executable instructions that, when executed, cause at least one computer to perform a method for use in a nuclear magnetic resonance (NMR) system. The method comprises detecting an air temperature of a sample chamber of the NMR system, monitoring a frequency response of a thermometer substance in a sample within the sample chamber during an NMR experiment, and determining an experimental resonance frequency value from the frequency response. The method further comprises comparing the experimental resonance frequency value to a reference resonance frequency value, and, in response to comparing the experimental resonance frequency value to the reference resonance frequency value, generating a compensation signal indicative of a target value of the air temperature to make the experimental resonance frequency value approximately equal to the reference resonance frequency value. The method further comprises comparing the target value of the air temperature to the detected air temperature.

According to another aspect, a method of controlling a temperature of a sample in a nuclear magnetic resonance (NMR) system is provided. The method comprises controlling an air temperature of a sample chamber of the NMR system to provide a first sample temperature for the sample, the sample being at least partially disposed in the sample chamber. The method further comprises measuring a resonance frequency reference value of a thermometer substance within the sample at the first sample temperature. The method further comprises applying a first radio frequency (RF) excitation sequence to the sample to induce heating within the sample. The method further comprises measuring a resonance frequency experimental value of the thermometer substance during application of the first RF excitation sequence. The method further comprises comparing the resonance frequency experimental value to the resonance frequency reference value, and generating a compensation signal indicative of an amount by which to alter the air temperature of the sample chamber to make the resonance frequency reference value and the resonance frequency experimental value approximately equal.

According to another aspect, at least one computer-readable storage medium is provided that is encoded with computer-executable instructions that, when executed, cause at least one computer to perform a method for controlling a temperature of a sample in a nuclear magnetic resonance (NMR) system. The method comprises controlling an air temperature of a sample chamber of the NMR system to provide a first sample temperature for the sample, the sample being at least partially disposed in the sample chamber. The method further comprises measuring a resonance frequency reference value of a thermometer substance within the sample at the first sample temperature. The method further comprises applying a first radio frequency (RF) excitation sequence to the sample to induce heating within the sample. The method further comprises measuring a resonance frequency experimental value of the thermometer substance during application of the first RF excitation sequence. The method further comprises comparing the resonance frequency experimental value to the resonance frequency reference value. The method further comprises generating a compensation signal indicative of an amount by which to alter the air temperature of the sample chamber to make the resonance frequency reference value and the resonance frequency experimental value approximately equal.

In the various aspects and embodiments summarized above, it will be appreciated that the NMR system may further comprise a field-frequency lock subsystem for stabilizing the static magnetic field of the NMR system. In some embodiments, the field-frequency lock subsystem operates using the same nuclei of an atomic species that are used for the temperature lock. In some embodiments, the field-frequency lock subsystem operates using different nuclei of an atomic species than are used for the temperature lock.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the present invention will become more apparent from the detailed description set forth below when taken in conjunction with the drawings.

DETAILED DESCRIPTION

Following below are more detailed descriptions of various concepts related to, and embodiments of, inventive systems, methods and apparatus for sample temperature control in NMR spectrometers. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

In various embodiments of the present invention, apparatus and methods for nuclear magnetic resonance (NMR) spectroscopy are described herein, which in exemplary implementations can stabilize the sample temperature in an NMR spectrometer with a precision and an accuracy of about 0.1 K or less. This sample temperature stabilization technique is referred to herein as "temperature-lock." In certain embodiments, the temperature-lock method automatically maintains the sample at the same reference temperature over the course of different NMR experiments.

Figure 8:
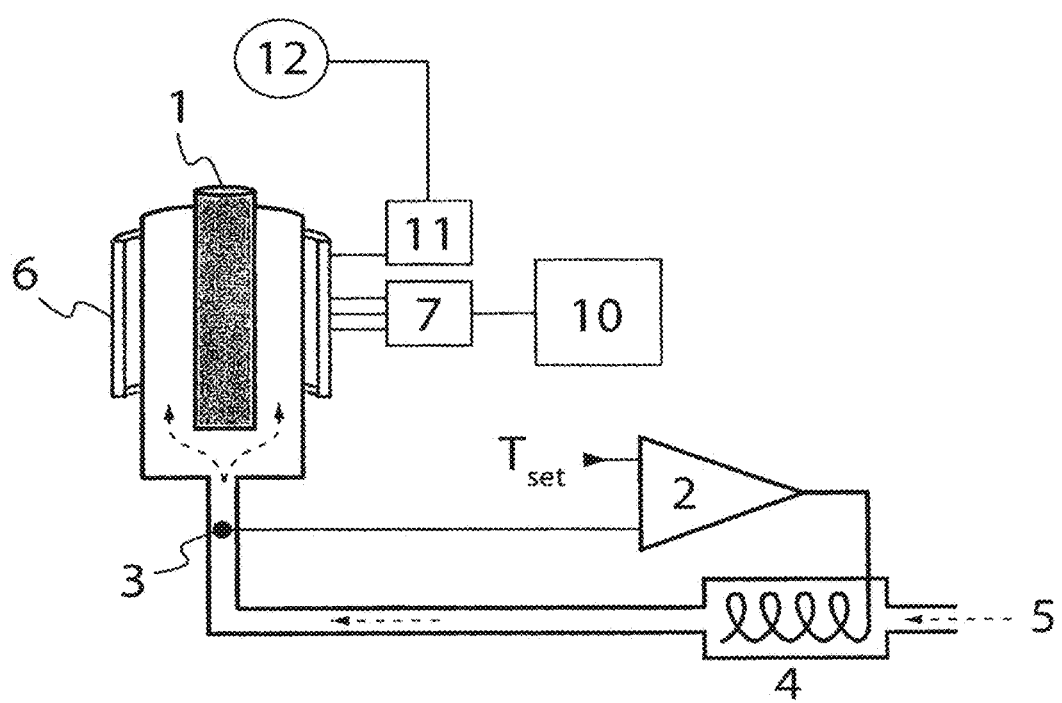
FIG. 8 illustrates a conventional NMR setup.

By way of introduction and for purposes of understanding, certain aspects of a conventional NMR spectrometer are first reviewed. FIG. 8 depicts an embodiment of a conventional NMR spectroscopy system, which comprises a sample tube 1, feedback controller 2, temperature sensor 3, temperature controller 4, RF coils 6, an NMR spectrometer 7, a main computer or processor 10, a field-frequency lock spectrometer 11, and static magnetic field $B_0$ coils 12. A portion of the sample tube 1 can be located inside the NMR magnetic coils 6, 12 and provide for the introduction of a sample into the NMR system. The sample tube can extend to a region outside the magnetic coils for access by a system user. The feedback controller 2 can provide a signal to the temperature controller 4 based on the temperature measured by the temperature sensor 3 and a user-defined temperature setting $T_{set}$. The temperature sensor 3 can comprise a thermistor, thermocouple or other conventional temperature measurement device. The temperature controller 4 can comprise a heating and cooling or a heating device. For the embodiment shown, an air stream 5 is provided by an air supply apparatus and is heated by heater 4. The air stream can flow as shown by the dashed arrows and bathe a portion of the sample tube 1 in which the sample of interest is located. The RF coils 6 can be one or multiple coils configured to be excited at various RF frequencies to produce RF magnetic fields in a region containing the sample. The NMR spectrometer 7 can comprise a spectrometer that provides one or more channels for one or several different nuclei. In various embodiments, the main computer 10 provides for overall control of the NMR spectrometer system.

For the conventional system shown in FIG. 8, the feedback controller 2, temperature sensor 3, temperature controller 4, and air stream 5 can be used to provide a thermal bath for a sample within the sample tube 1 and to control the sample temperature. For example, thermocouple 3 measures the air stream temperature and feedback controller 2 regulates the heater 4 so that the detected temperature (represented by a voltage in an analog system or by a digital signal) matches the user-defined temperature $T_{set}$. In operation, these elements providing a thermal bath for the sample operate independently from the spectrometer 7 in the conventional setup. The NMR spectrometer 7 can include one or several channels for the nuclei of interest, e.g., the three channels $^1$H, $^{13}$C and $^{15}$N for biological triple resonance experiments. The field-frequency lock spectrometer 11 and static field coils 12 can maintain the static $B_0$ field constant over the course of a measurement by using a signal from a suitable field-frequency lock nucleus. The field-frequency lock can operate independently of the acquisition of the experiments and of the temperature unit. (Exceptions are implementations which require usage of the field-frequency lock channel for some pulses. In those implementations, the field-frequency lock channel can be alternatingly switched between the two demands.) In some embodiments, the chemical shift scale for all nuclei is defined by arbitrarily setting the field-frequency resonance to a user-defined fixed value at all temperatures, e.g., 4.7 ppm for $D_2O$, and then referencing all other nuclei indirectly to this fixed point by their relative gyromagnetic ratios. This scheme of chemical shift referencing is also used in some non-limiting embodiments of the present invention.

Figure 1:
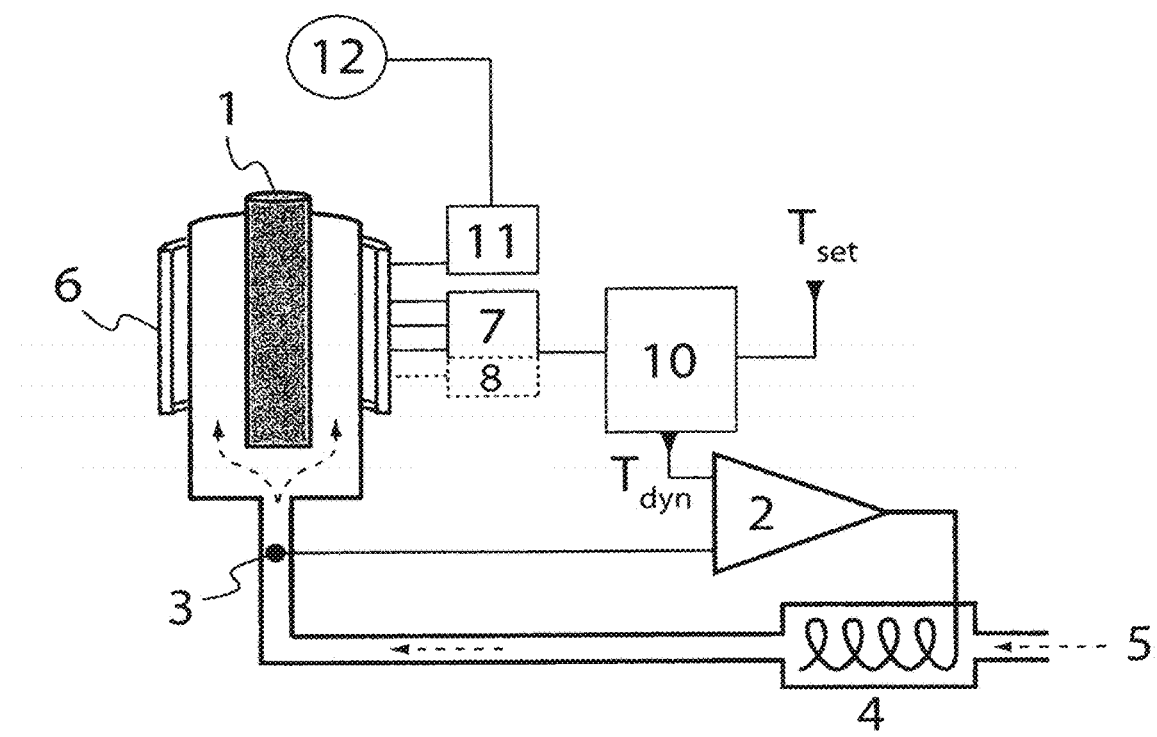
FIG. 1 is a block diagram of one embodiment of a temperature-lock NMR system.

The setup of one non-limiting embodiment of the technology described herein is shown in FIG. 1. In the figure, 1 represents the sample tube, sitting inside the NMR magnet. An air stream 5 is provided by an air supply and can be heated and/or cooled by temperature controller 4. The air stream follows the way of the dashed arrows. 3 represents a thermocouple or other conventional temperature measurement device. 10 depicts the main computer. Feedback controller 2 can provide a signal for the temperature controller 4 based on the temperature measured by temperature sensor 3 and the dynamic temperature control value $T_{dyn}$ (which in some embodiments may correspond to a target air temperature value) provided by processor 10. This temperature signal is represented either by a voltage in analog systems, or by a digital signal. RF coil 6 comprises one or multiple coils tunable to the resonance frequencies of all required nuclei. Spectrometer 7 comprises an NMR spectrometer that contains channels for one or several different nuclei. Block element 8 represents an optional additional channel of the NMR spectrometer. 11 represents the channel for the field-frequency lock that controls the static field coils 12 to maintain the global $B_0$ field at the reference value. It should be appreciated that additional connections between the main computer 10 and field-frequency lock channel 11 and static field coils 12 may exist in some embodiments, but are not shown in the drawing for purposes of illustration.

Compared to the conventional setup, the NMR sample of interest now contains an additional inert thermometer substance, the temperature-lock substance Z with the temperature-lock nucleus L. In various embodiments, the inert thermometer substance does not chemically react with a substance being studied in the NMR experiment, or is biocompatible with the substance being studied in the experiment. An embodiment for aqueous samples comprises $Z=H_2O$ and $L=^{17}O$, but many other choices are possible as discussed below. If the nucleus L is not covered by the existing channels of the conventional NMR spectrometer setup, an additional channel 8 for the nucleus L is added. In this case, the coils 6 are adapted to be tunable to this nucleus. The resonance frequency of the nucleus L in the compound Z is continuously measured by channels of the NMR spectrometer 7 or via channel 8 using either 1D FT-NMR or frequency sweeping as described below. The detected chemical shift of the temperature-lock nucleus, $\delta(L^Z)$, or the detected resonance frequency, can be continuously or semi-continuously handed over to the main spectrometer computer 10 which stores and analyses these data. Computer or system processor 10 can employ a management of experiments and temperature (MET) procedure, which derives a dynamic temperature control signal, $T_{dyn}$, for the negative feedback controller 2 and simultaneously manages the execution of dummy scans and acquisition of the experiments. The controller 2 in some embodiments may comprise a comparator, a PID controller, and a driver. Other types of controllers are also possible. As mentioned, in some non-limiting embodiments, $T_{dyn}$ represents a target, or desired, air temperature value.

Figure 2:
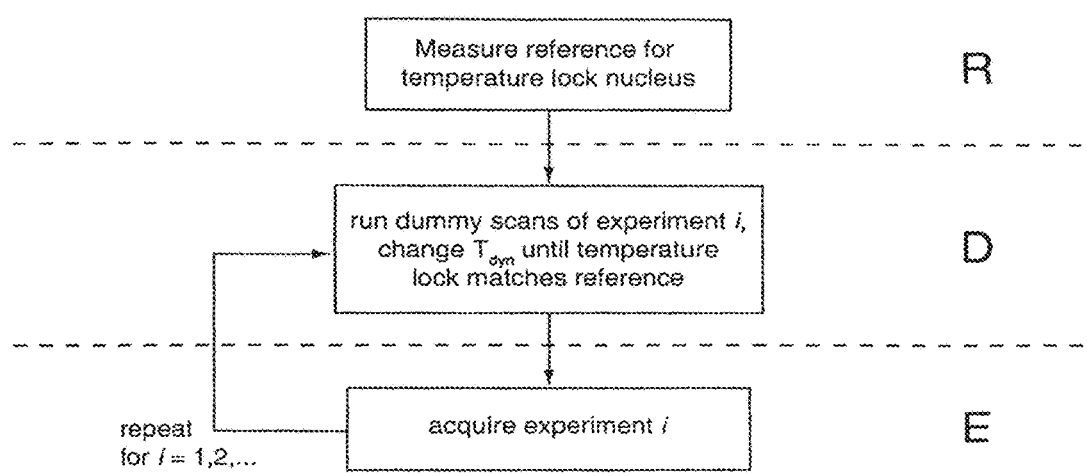
FIG. 2 is an embodiment of a management of experiments and temperature (MET) procedure.

A simplified embodiment for the MET procedure is shown in FIG. 2. The depicted embodiment comprises three main phases R, D and E standing for reference, dummy scans and experiment, respectively. The index i corresponds to the experiment number in a series of experiments. The dashed lines represent the borders between the operational phases. In phase R, which can be initially executed once, a reference value for the chemical shift of nucleus L in compound Z in the sample is recorded. Phases D and E are then executed once for each of multiple experiments. During phase D, the dummy scans are executed. These dummy scans execute the full RF pulse scheme, leading to sample heating. During the continuous execution of these dummy scans, $T_{dyn}$ is adjusted until the sample temperature has reached a steady state and the chemical shift readings match the reference acquired in phase R. Then, in phase E, the actual experiment is recorded. Typical lengths are 10-40 seconds for phase R, 10-500 seconds for phase D, and 10 minutes-10 days for phase E.

Figure 3:
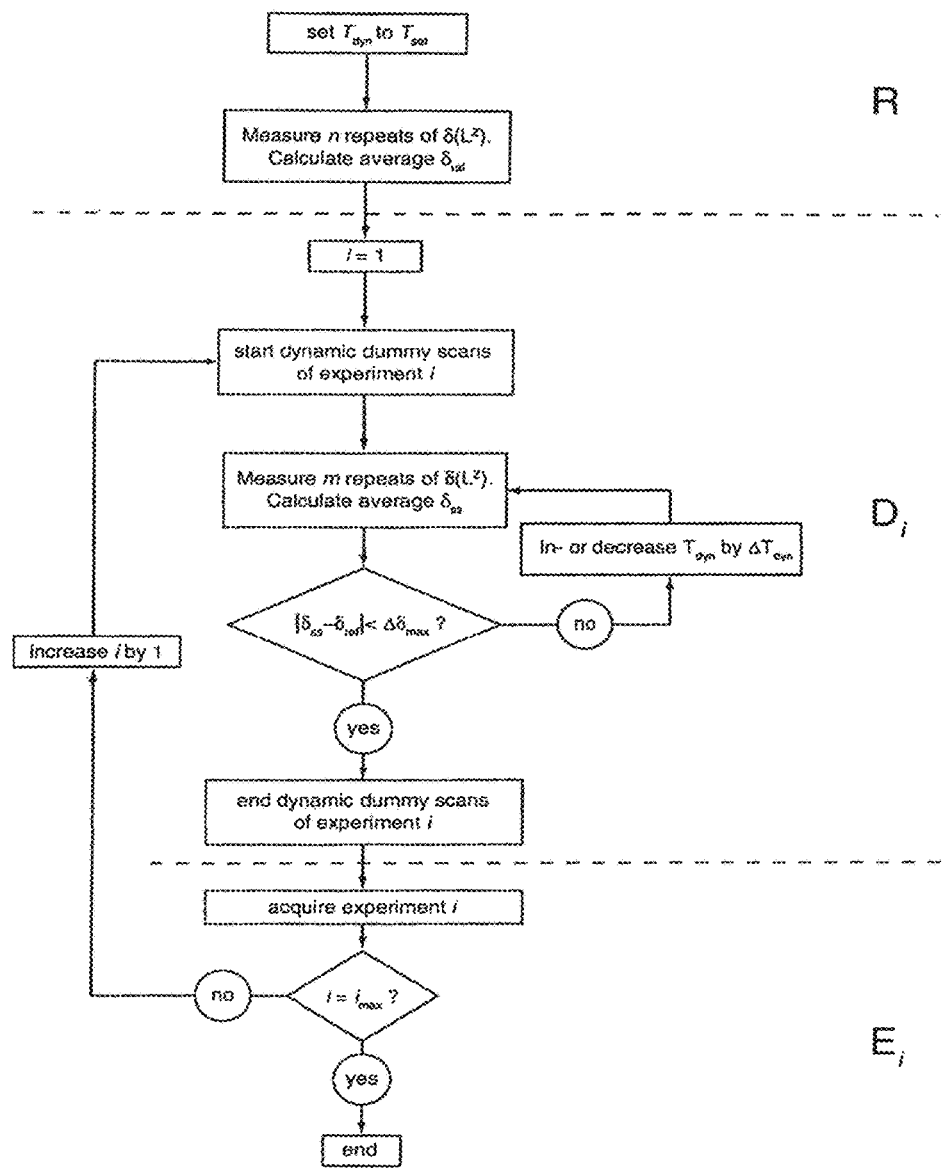
FIG. 3 represents one embodiment of the MET procedure.

One embodiment of the MET procedure is shown in FIG. 3. In the embodiment depicted, the procedure starts at the top and follows the arrows. Boxes denote action steps and rhombs denote decision steps. The procedure ends at the bottom after all experiments have been measured. The letters R, D, E correspond to the three main phases of the procedure as outlined in FIG. 2, the index i corresponds to the experiment number in a series of experiments. The dashed lines indicate the borders between the phases.

For the embodiment of FIG. 3, after the sample has been inserted, phase R starts and the chemical shift reference value $\delta_{ref}$ is acquired with the heater control set to $T_{set}$, the desired sample temperature chosen by the user. In the absence of experiments and thus in the absence of strong RF-heating, the sample temperature is substantially equal to the air stream temperature, which is accurately and precisely controlled by the thermocouple. For example, the sample temperature is within about ±0.1 K of the air stream temperature. The setting $T_{dyn}=T_{set}$ can yield the desired sample temperature, since the sample heating caused by the pulses used to acquire $\delta_{ref}$ can be neglected. In the embodiment with 1D FT NMR, the $\delta_{ref}$ is acquired by a single scan of $\delta(L^Z)$ or, to improve the accuracy, the average of n scans, where n is a user-defined value. Phase R is completed and phase $D_1$ begins by starting the dummy scans of experiment 1. The dummy scans employ the full radio-frequency scheme of the real experiment and simultaneously measure $\delta(L^Z)$ (FIG. 5). Thus, the dummy scans induce the same amount of radio-frequency heating and thus change sample temperature by the same amount as the real experiment. The average of m measurements of $\delta(L^Z)$ during the dummy scans, $\delta_{ss}$, can be calculated and compared with the reference value $\delta_{ref}$, where m is a user-defined value. If $\delta_{ss}$ and $\delta_{ref}$ differ by not more than a user-defined tolerance value $\Delta\delta_{max}$, the steady state has been reached. If they do differ by a larger amount, the temperature reference value $T_{dyn}$ for the controller is changed by an amount $\Delta T_{dyn}$. The value of $\Delta T_{dyn}$ can be a user-defined fixed value, or it can be made dependent on the difference $\delta_{ss}-\delta_{ref}$ according to a predefined schedule. Since the temperature change coefficient of the nucleus L relative to the lock is known or can be determined from trial experiments, the sign of $\Delta T_{dyn}$ can directly be determined from the sign of $\delta_{ss}-\delta_{ref}$. After changing the value of $T_{dyn}$, a new value for $\delta_{ss}$ is measured. Optionally, several dummy scans are executed, before this new measurement takes place. Once the steady-state condition $|\delta_{ss}-\delta_{ref}|<\Delta\delta_{max}$ is reached, phase $D_1$, the execution of the dummy scans, is terminated and phase $E_1$, the regular acquisition of the experiment, is started. This transition is preferably executed without an interruption of the pulse rhythm. The $T_{dyn}$ value is no longer changed during the phase $E_1$. $\delta(L^Z)$ is not recorded during $E_1$. If another experiment is scheduled, phases $D_2$ and then $E_2$ follow $E_1$. This is iterated until all scheduled experiments have been recorded. As an illustration of the performance of the MET procedure, the time-course of $\delta(L^Z)$ and $T_{dyn}$ during two experiments is shown in FIG. 4.

Although the embodiment above is described with reference to chemical shift $\delta(L^Z)$, it will be appreciated that nuclear magnetic resonance frequency values, e.g., $\omega_r(L^Z)$, of the temperature-lock nucleus L can be measured, tracked, and used in some embodiments the feedback method. For example, $\omega_r(L^Z)$ can be measured prior to the application of RF pulses to determine a reference value $\omega_{ref}$, and $\omega_r(L^Z)$ can be measured during dummy scans to determine a shifted resonance frequency value $\omega_{ss}$ due to heating of the sample by the RF pulses. The magnitude of the difference $|\omega_{ss}-\omega_{ref}|$ can then be examined to determine whether it is with a user defined tolerance value $\Delta\omega_{max}$, and whether $T_{dyn}$ should be adjusted. In some embodiments, the chemical shift or nuclear magnetic resonance frequency is measured with respect to a standard, e.g., with respect to a nuclear magnetic resonance frequency of a selected nucleus. The selected nucleus can be a nucleus used for field lock of the NMR apparatus in some embodiments, or can be a nucleus not used for the field lock. In some embodiments, the selected nucleus has a resonance frequency dependent upon sample temperature. In certain embodiments, the selected nucleus has a resonance frequency substantially independent of temperature, e.g., less than about 5 ppm/K, less than about 2 ppm/K, less than about 1 ppm/K, less than about 0.5 ppm/K, and yet less than about 0.1 ppm/K in some embodiments.

Figure 4:
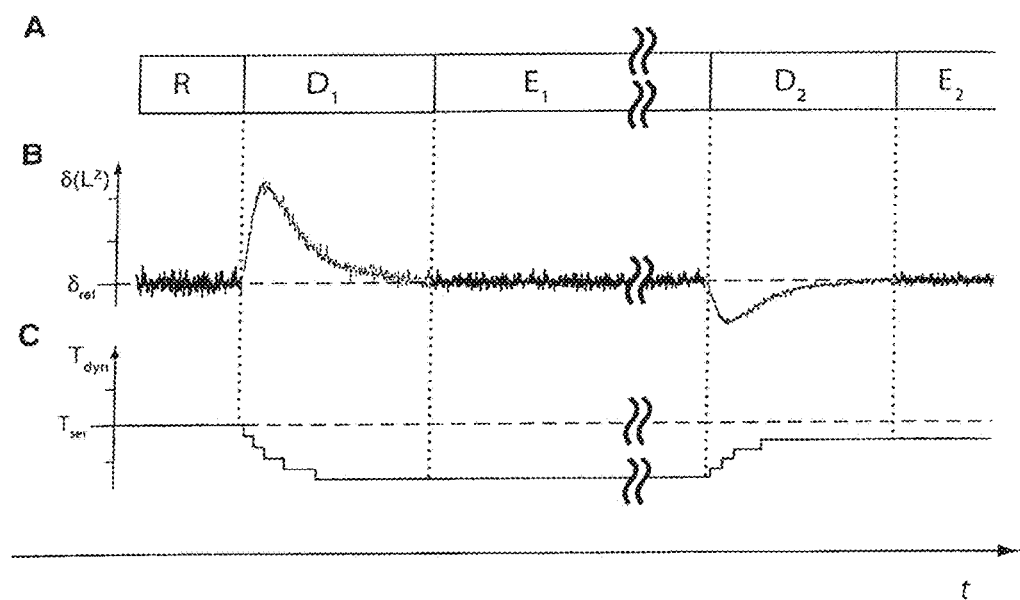
FIG. 4 depicts functional aspects of one embodiment of the temperature-lock method.
Figure 5:
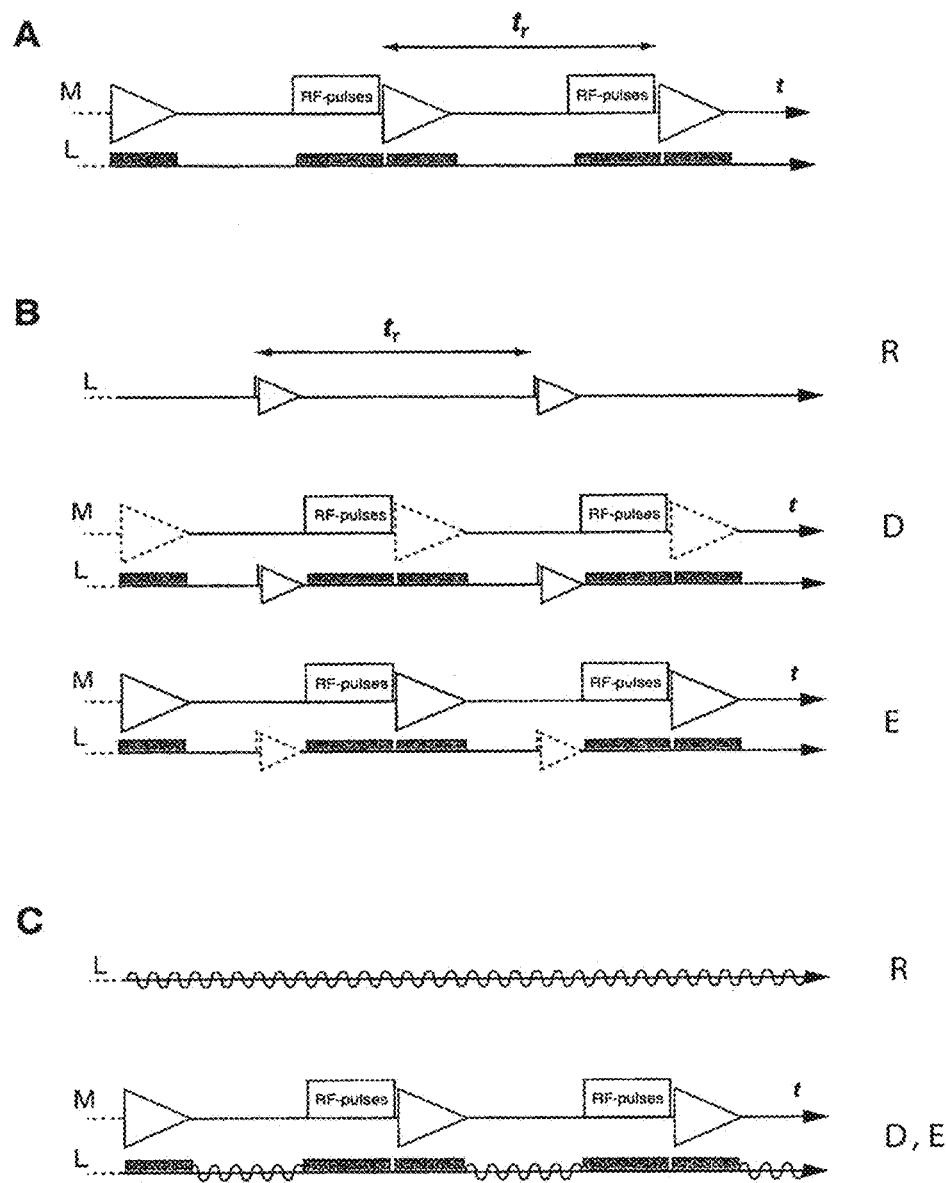
FIG. 5 depicts various embodiments for nuclear magnetic resonance frequency measurements without and with temperature-locking.

FIG. 4 depicts functional aspects of one embodiment of the temperature-lock method. Time is depicted by the horizontal axis as increasing from left to right. Vertical dotted lines mark equal time points. The phases R, D, E of the MET procedure, as defined in FIG. 2 are represented by the boxes in FIG. 4A. FIG. 4B represents the measured chemical shift of the temperature-lock nucleus, $\delta(L^Z)$. The dashed horizontal line indicates the value of $\delta_{ref}$. FIG. 4C represents dynamic temperature control settings, $T_{dyn}$, resulting from the MET procedure are shown. The dashed horizontal line is the temperature setting $T_{set}$ desired by the user.

In some embodiments, $\delta(L^Z)$ is acquired during $E_1$ in an interleaved fashion with the experiment, but without disturbing its pulse scheme (FIG. 5). These measurements and possible $T_{dyn}$ adjustments may be used to compensate possible failures or fluctuations of the air stream or to compensate pulse sequences that change their rf-heating during the course of the experiment.

FIG. 5A represents an experimental scheme used for a main NMR experiment in the absence of the temperature-lock. The RF-pulse sequence is shown as open boxes. Recording of free induction decays (FID) is shown as open triangles. $t_r$ denotes the repetition time of the experiment. This repetition time is used in all panels of this figure. L represents the temperature-lock channel. M represents all other channels. The grey boxes denote pulse segments on nucleus L when the nucleus L is used for the main experiment.

FIG. 5B represents an embodiment of an NMR experiment employing temperature-lock with 1D FT-NMR. The letters R, D, E denote the three phases of the MET procedure as defined in FIG. 2. R: Measurement of the reference value in the absence of any other experiment. A 90° pulse (vertical bar) excites the steady-state magnetization of L with subsequent recording of an FID (triangle). D: Pulse scheme during the dummy scans. The FID recordings on channel M (dashed triangles) are optional and are otherwise replaced by equivalent delays. E: Recording of the experiment. The acquisition of the temperature-lock frequency on channel L (dashed) is optional in this phase.

FIG. 5C depicts an embodiment of an NMR experiment employing temperature-lock with frequency sweeping. The letters R, D, E denote the three phases of the MET procedure. R: Measurement of the reference value in the absence of any other experiment. The frequency sweeping is indicated by wavy lines. D, E: Pulse scheme during the dummy scans and the experiment. Frequency sweeping is switched off during pulses on the nucleus L that might also be used for the main experiment.

According to one aspect of the present invention, an absolute calibration of the chemical shift dependence on temperature for the lock nucleus L is not required. After the reference signal is acquired, all the temperature-lock has to do is bring the resonance back to this reference value by changing the temperature setting $T_{dyn}$. Thus, in some embodiments, not even a linear temperature dependence of the temperature-lock nucleus is a requirement. In some embodiments, it is sufficient if the dependence is strictly monotonic.

For the detection of the resonance frequency or chemical shift of the nucleus L by the spectrometer, two implementations can be used as depicted in FIG. 5: 1D FT-NMR and frequency-sweeping NMR. One implementation comprises acquisition of a 1D FT-NMR spectrum of nucleus L and subsequent automated peak-picking (FIG. 5B). In another implementation with frequency sweep NMR, the resonance frequency or chemical shift of L is detected by frequency scanning (FIG. 5C), using the same or a similar scanning technology that is used for conventional field-frequency-locks. In the implementation with 1D FT-NMR, a possible embodiment for the automated peak picking routine used for the identification of the peak maximum in the frequency spectrum is described in: Hiller, S. et al. *J. Biomol. NMR* 42, 179-195 (2008). In this peak-picking routine, the global maximum of the spectrum is identified and the position of the peak maximum is interpolated by a symmetrization procedure involving the intensities of the two neighboring data points in each dimension. Alternative peak picking routines can be applied, or the routines can be modified to recognize certain features of the spectrum.

The choice of a suitable lock compound is guided by the following considerations. The main NMR experiment should not be impacted by the presence of the temperature-lock nuclei, and thus the nucleus L should be different to the nucleus, whose steady-state magnetization is used for the experiment of interest. In certain embodiments, L is contained in the molecule Z, which is a small molecule with sharp resonance lines. In some embodiments, Z is chosen to be a substance that is already part of the desired sample preparation, so that no change in the chemical composition of the sample is required, for example, a nucleus from the solvent, such as $^{17}$O-water or $^{13}$C-labelled organic solvents; or buffer components, such as $^{31}$P-phosphate, salts, organic buffer compounds, detergents or other additive molecules. For protein samples in aqueous solution, $^{13}$C-labelled and perdeuterated amino acids, or $^{13}$C-labelled 2,2-Dimethyl-2-silapentane-5-sulfonic acid (DSS) may also be the temperature-lock compound of choice. For biomolecular NMR, the use of $^{13}$C has the advantage that no channel needs to be added to conventional triple-resonance probe heads to implement the temperature-lock. $^{17}$O has the strong advantage of universal applicability on aqueous samples, however, it may require an additional channel over those in triple-resonance probes in some embodiments.

Since the chemical shift referencing is based on the field-frequency lock, the effectively observed temperature shifts can comprise a combination of the temperature shifts of the field-lock resonance and the nucleus L in the substance Z. Thus, even nuclei that intrinsically have a weak or no temperature dependence can be suitable temperature-lock substances, if the field-frequency lock substance has sufficiently strong temperature dependence.

Figure 6:
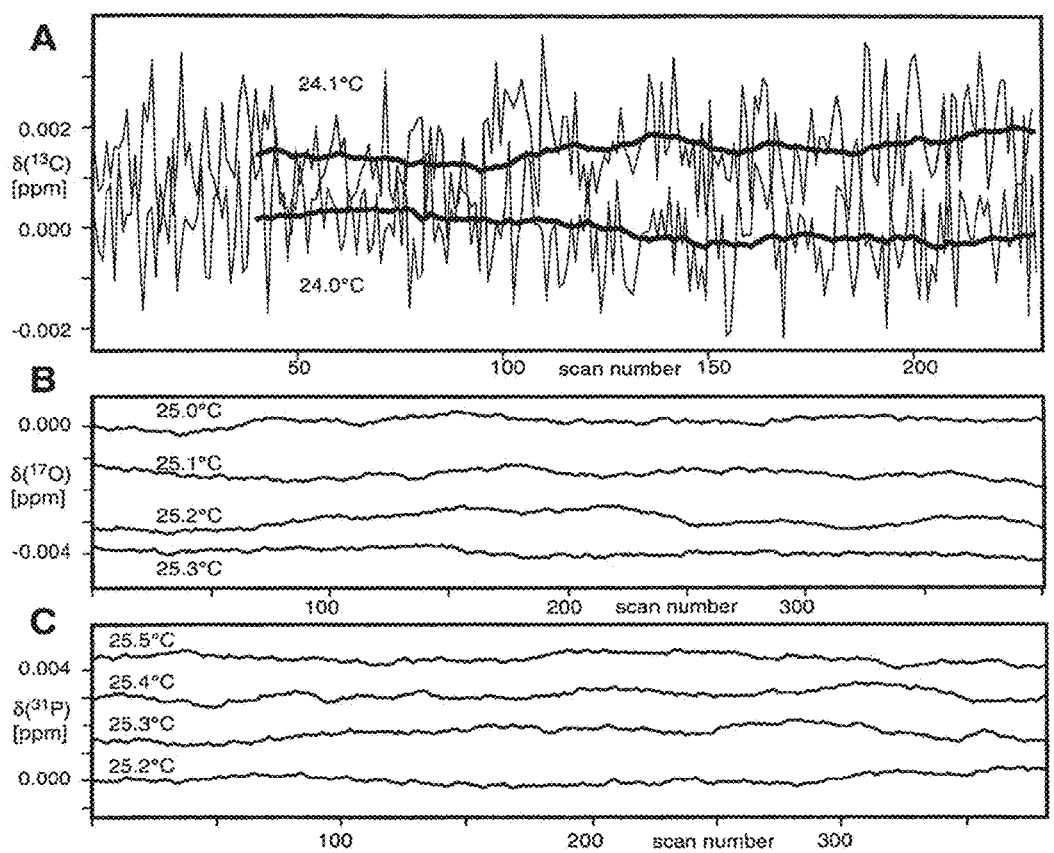
FIG. 6 shows chemical shift measurements for three temperature-lock nuclei in aqueous solution, measured at 500 MHz field strength.

FIG. 6 shows temperature traces for the three different compounds $^{13}$C-alanine, $^{31}$P-phosphate and $^{17}$O-water based on 1D FT NMR and automated peak picking. The temperature traces are as follows: $^{13}$C-alanine (FIG. 6A), $^{17}$O-water (FIG. 6B), and $^{31}$P-phosphate (FIG. 6C). The absolute temperatures are indicated next to each data set. Each scan was taken in a 1D FT-NMR experiment followed by automated peak picking. In FIG. 6A the individual scans (thin lines) are shown in addition to the gliding average of the last 40 scans (bold lines). In FIGS. 6B-C, the gliding averages of 40 scans are shown. Temperature intervals of 0.1 K could be unambiguously distinguished in each case and are thus an upper limit to the obtainable accuracy, the amount of the lock substance and the number of averaged scans. Effective chemical shift changes relative to the $D_2O$ resonance are about 20 ppb/K for $^{13}$C-alanine, 10 ppb/K and $^{31}$P-phosphate, and −10 ppb/K for $^{17}$O-water on their respective ppm scales. These results show that an embodiment of the temperature-lock is feasible with each of these three nuclei.

Figure 7:
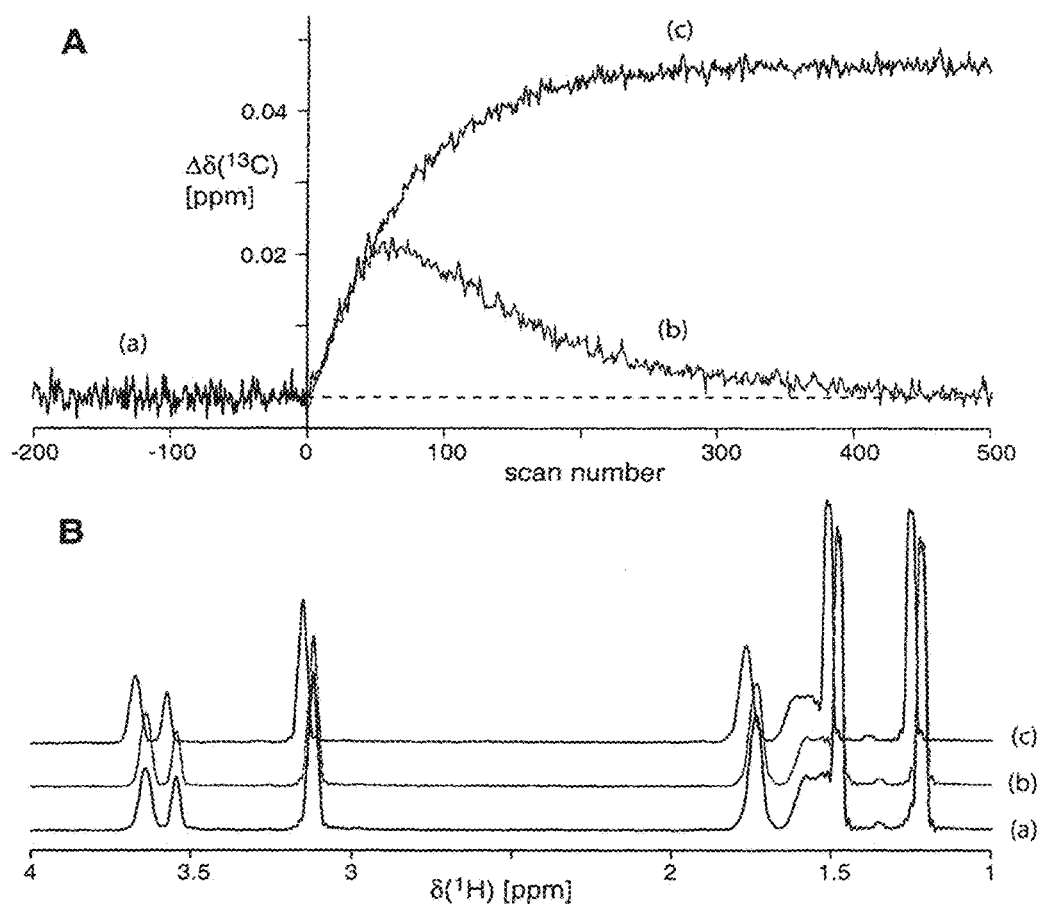
FIG. 7 depicts the application and effect of temperature locking in an NMR spectroscopy experiment.

FIG. 7 shows as an example the application of $^{13}$C-alanine as temperature-lock compound in a 2D [$^1$H,$^1$H]-TOCSY experiment with strong RF-heating. FIG. 7A depicts chemical shift data based on the resonance frequency of the temperature-lock nucleus $^{13}$C in the compound alanine. Trace (a) shows the chemical shift of the temperature-lock nucleus at a reference temperature of about $T_{set}$=25° C. The average of 40 of these reference scans serves as the temperature lock reference value $\delta_{ref}$ (dashed horizontal line). Trace (b) shows chemical shift measurements of the temperature-lock nucleus during 500 dummy scans of a 2D [$^1$H,$^1$H]-TOCSY experiment with temperature adjustments by the MET procedure. Trace (c) shows chemical shift measurements of the temperature-lock nucleus during 500 dummy scans of a 2D [$^1$H,$^1$H]-TOCSY experiment without temperature adjustments by the MET procedure. FIG. 7B depicts NMR spectra of the same sample in the same experimental situation. (a): 1D $^1$H-NMR spectrum at the reference temperature of about $T_{set}$=25° C. (b)/(c): First scan of a 2D [$^1$H,$^1$H]-TOCSY experiment with/without using the temperature lock techniques. The NMR spectra for (b) and (c) were recorded directly after the corresponding dummy scans for each case.

The experiment of FIG. 7 shows that the RF pulse sequences increase the effective sample temperature by about 2.3 K, inducing large chemical shift changes of the resonance frequency of the temperature-lock nucleus. By a comparison of the resonance positions of the first scan of the 2D [$^1$H,$^1$H]-TOCSY experiment with the 1D $^1$H-NMR reference spectrum at the reference temperature, which were virtually identical (FIG. 7B), shows that the temperature calibration obtained using the temperature lock to be functional and highly accurate.

The experimental details for the acquisition of the data in FIGS. 6 and 7 were as follows. For $^{13}$C as temperature-lock nucleus, a sample of 50 mM [U—$^{13}$C]-Alanine was used. Measurements with $^{17}$O and $^{31}$P as temperature-lock substance were made with a sample of 50 mM phosphate buffer in [5% $^{17}$O, 7% $^2$H]—$H_2O$. The 1D NMR spectra were recorded with a 90° excitation pulse followed by FID acquisition. 256, 11270, 1024 complex points were recorded in 400 ms, 1000 ms, 61 ms for $^{13}$C, $^{31}$P, $^{17}$O, respectively. This interscan delay was adjusted to result in a repetition time of 1 s. The signal was zero-filled to 32 k complex points, multiplied with a cosine window function and Fourier transformed. From the 1D spectrum of $^{13}$C-alanine, one resonance line from the multiplett of the $C^\beta$ atom at about 19 ppm was selected. The position of the peak maximum was interpolated from the intensity of the maximum and its two neighboring points. The 1D spectra of $^{17}$O-water and $^{31}$P-phosphate featured exactly one resonance line each and in these experiments the global maximum was picked without interpolation. The peak positions were stored continuously. Averages were calculated from 40 consecutive measurements. However, the parameters described here represent only one possible non-limiting embodiment, as many alternative choices are possible.

In addition to stabilization of the temperature, the proposed method allows the transfer of the temperature calibration of a given sample to another spectrometer, since the same resonance frequency relative to the static field lock (in ppm) must be observed at the same temperature. This condition is true as long as the chemical composition of the sample is not changed and the parameters for the temperature lock have been adjusted in a way to reproduce the same results. Thus, for studies of the same sample on different spectrometers, the temperature lock can be used to have identical temperature calibrations on all fields at all experiments.

According to one aspect of the present invention, the sample temperature is measured as the sample average, disregarding possible temperature gradients along the sample, which are known to occur in different size depending on the probe geometry and other factors.

According to some embodiments, the dynamic implementation of the dummy scans is used, and in some non-limiting embodiments the experiment always starts only when the steady state has been reached. However, not all embodiments are limited in this manner. For example, other implementations are also possible, such as using a fixed number of scans, a combination of a dynamic value with a fixed upper limit, or other possible implementations.

Some aspects of the technology described herein may exhibit one or more of the following advantages compared to conventional systems and methods: (a) 20-100 fold improvement of the accuracy when compared to existing non-interactive methods (b) full or nearly complete automation when compared to interactive methods (c) the experiments in some embodiments may start only when the steady state is truly reached (d) direct transferability of a calibration on the same sample between different spectrometers.

All literature and similar material cited in this application, including, but not limited to, patents, patent applications, articles, books, treatises, and web pages, regardless of the format of such literature and similar materials, are expressly incorporated by reference in their entirety. In the event that one or more of the incorporated literature and similar materials differs from or contradicts this application, including but not limited to defined terms, term usage, described techniques, or the like, this application controls.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Any computing device or computer configured to implement the various functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A nuclear magnetic resonance (NMR) system, comprising:
   a sample chamber;
   a heater to adjust an air temperature of air incident on the sample chamber;
   a sensor to monitor a frequency response of a thermometer substance within the sample chamber and to provide a varying output signal indicative of the frequency response of the thermometer substance as a temperature of the thermometer substance varies; and
   signal processing circuitry coupled to the sensor to receive the varying output signal of the sensor and configured to:

generate a compensation signal indicative of a target value for the air temperature;
compare a signal representative of the air temperature incident on the sample chamber and the compensation signal; and
produce a feedback control signal, based on the comparison, for adjusting the heater to increase or decrease the temperature of the air incident on the sample chamber.

2. The NMR system of claim 1, wherein the frequency response comprises a nuclear magnetic resonance frequency or chemical shift corresponding to an atomic species of the thermometer substance.

3. The NMR system of claim 2, wherein the sensor comprises an RF coil and a spectrometer.

4. The NMR system of claim 3, wherein the spectrometer is configured to determine the nuclear magnetic resonance frequency or chemical shift using frequency sweeping or one-dimensional Fourier transform NMR.

5. The NMR system of claim 2, wherein the atomic species comprises an atomic nucleus selected from the following group: $^{17}O$, $^{13}C$, $^{15}N$, $^{2}H$, $^{1}H$, and $^{31}P$.

6. The NMR system of claim 1, wherein the thermometer substance comprises $H_2O$, a buffer component, or a detergent.

7. The NMR system of claim 1, wherein the thermometer substance comprises an organic solvent or an organic buffer compound.

8. The NMR system of claim 1, wherein the thermometer substance comprises a phosphate or a salt.

9. The NMR system of claim 1, wherein the thermometer substance comprises an amino acid or 2,2-Dimethyl-2-silapentane-5-sulfonic acid (DSS).

10. The NMR system of claim 1, wherein the sensor comprises a multi-channel probe configured to detect frequency response signals of multiple nuclei.

11. The NMR system of claim 1, wherein the sensor comprises a spectrometer configured to receive and process data from a plurality of NMR experiments.

12. The NMR system of claim 11, wherein the sensor is configured to monitor the frequency response of the thermometer substance during the course of at least one of the NMR experiments.

13. A method of operating a nuclear magnetic resonance (NMR) system, the method comprising:
detecting an air temperature of air incident on a sample chamber of the NMR system;
monitoring a frequency response of a thermometer substance within the sample chamber, the frequency response comprising a nuclear magnetic resonance frequency or chemical shift corresponding to a first atomic species of the thermometer substance and the first atomic species differing from a second atomic species used for field locking of the NMR system;
generating a compensation signal based upon the monitored frequency response, wherein the compensation signal is indicative of a target value for the air temperature; and
producing a feedback control signal, based on the compensation signal, for adjusting a heater to increase or decrease the temperature of the air incident on the sample chamber.

14. The method of claim 13, further comprising:
determining an experimental resonance frequency value from the monitored frequency response;
comparing the experimental resonance frequency value to a reference resonance frequency value; and
generating the compensation signal based on the comparison of the experimental resonance frequency value and the reference resonance frequency value.

15. The method of claim 14, further comprising applying NMR pulses, by the NMR system, while determining the experimental resonance frequency, wherein the reference resonance frequency is determined at a time when the NMR pulses are not applied by the NMR system.

16. The method of claim 14, further comprising iteratively performing the acts of detecting an air temperature, monitoring a frequency response, comparing the experimental resonance frequency value to the reference resonance frequency value, generating a compensation signal, producing a feedback control signal, and further comprising adjusting the heater to make the experimental resonance frequency value approximately equal to the reference resonance frequency value.

17. The method of claim 13, wherein the thermometer substance comprises a nucleus selected from the following group: $^{17}O$, $^{13}C$, $^{15}N$, $^{2}H$, $^{1}H$, and $^{31}P$.

18. The method of claim 13, wherein the thermometer substance comprises $H_2O$, a buffer component, or a detergent.

19. The method of claim 16, further comprising initiating an NMR experiment after the experimental resonance frequency value approximately equals the reference resonance frequency value.

20. The method of claim 13, wherein the thermometer substance comprises an organic solvent or an organic buffer compound.

21. The method of claim 13, wherein the thermometer substance comprises a phosphate or a salt.

22. The method of claim 13, wherein the thermometer substance comprises an amino acid or 2,2-Dimethyl-2-silapentane-5-sulfonic acid (DSS).

23. At least one computer-readable storage medium encoded with computer-executable instructions that, when executed by at least one processor of a nuclear magnetic resonance (NMR) system, cause the NMR system to perform a method comprising acts of:
detecting an air temperature of air incident on a sample chamber of the NMR system;
monitoring a frequency response of a thermometer substance within the sample chamber, the frequency response comprising a nuclear magnetic resonance frequency or chemical shift corresponding to a first atomic species of the thermometer substance and the first atomic species differing from a second atomic species used for field locking of the NMR system;
generating a compensation signal based upon the monitored frequency response, wherein the compensation signal is indicative of a target value for the air temperature; and
producing a feedback control signal, based on the compensation signal, for adjusting a heater to increase or decrease the temperature of the air incident on the sample chamber.

24. The at least one computer-readable storage medium of claim 23, wherein the computer-executable instructions further cause the NMR system to execute acts of:
determining, while applying an NMR pulse sequence, an experimental resonance frequency value from the monitored frequency response;
comparing the experimental resonance frequency value to a reference resonance frequency value;

generating the compensation signal based on the comparison of the experimental resonance frequency value and the reference resonance frequency value; and initiating an NMR experiment using the NMR pulse sequence after the experimental resonance frequency value approximately equals the reference resonance frequency value.

25. The method of claim 13, further comprising:

applying a first radio frequency (RF) excitation sequence to the sample chamber to induce heating within a sample;

measuring a resonance frequency experimental value of the first atomic species during application of the first RF excitation sequence;

comparing the resonance frequency experimental value to a resonance frequency reference value measured for the first atomic species when the first RF excitation sequence is not applied to the sample chamber;

generating the compensation based on the comparison; and applying the feedback control signal to control a heater to alter the air temperature and make the resonance frequency reference value and the resonance frequency experimental value approximately equal.

26. The method of claim 25, further comprising applying a second RF excitation sequence to the sample while applying the feedback control signal, the second RF excitation sequence corresponding to performing an NMR experiment.

27. The method of claim 26, further comprising:

applying the first RF excitation sequence for a duration between 10 seconds and 500 seconds; and applying the second RF excitation sequence for a duration between 10 minutes and 10 days.

28. The method of claim 26, further comprising applying repetitively and alternately the first RF excitation sequence and the second RF excitation sequence.

29. The at least one computer-readable storage medium of claim 23, wherein the reference resonance frequency value is measured at a time when no NMR pulse sequence is applied by the NMR system.

* * * * *

UNITED STATES PATENT AND TRADEMARK OFFICE
CERTIFICATE OF CORRECTION

| | | |
|---|---|---|
| PATENT NO. | : 10,094,892 B2 | Page 1 of 1 |
| APPLICATION NO. | : 14/562028 | |
| DATED | : October 9, 2018 | |
| INVENTOR(S) | : Sebastian Hiller et al. | |

It is certified that error appears in the above-identified patent and that said Letters Patent is hereby corrected as shown below:

In the Specification

At Column 1, Lines 25-28, please change the paragraph:
"This invention was made with government support under Grant No. GM 47467 awarded by the National Institute of Health. The government has certain rights in the invention."

To:
-- This invention was made with government support under GM047467 awarded by the National Institutes of Health. The government has certain rights in the invention. --

Signed and Sealed this
Thirteenth Day of August, 2024

Katherine Kelly Vidal
*Director of the United States Patent and Trademark Office*